United States Patent
Chen et al.

(10) Patent No.: US 12,287,195 B2
(45) Date of Patent: Apr. 29, 2025

(54) COATER CUP DEFORMATION TESTING DEVICE AND METHOD OF COATER CUP DEFORMATION TESTING

(71) Applicant: NANYA TECHNOLOGY CORPORATION, New Taipei (TW)

(72) Inventors: Li-Chung Chen, Taoyuan (TW); Cheng Liu, New Taipei (TW); Chuan-Chen Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 846 days.

(21) Appl. No.: 17/453,652

(22) Filed: Nov. 5, 2021

(65) Prior Publication Data
US 2023/0141638 A1     May 11, 2023

(51) Int. Cl.
G01B 5/30     (2006.01)
H01L 21/687   (2006.01)

(52) U.S. Cl.
CPC .......... G01B 5/30 (2013.01); H01L 21/68785 (2013.01)

(58) Field of Classification Search
CPC .............. G01B 3/42; G01B 5/28; G01B 5/30
USPC ................................... 33/562, 563
See application file for complete search history.

(56) References Cited

U.S. PATENT DOCUMENTS

| | | | | |
|---|---|---|---|---|
| 4,164,076 A * | 8/1979 | Carrigan | ................ | B23Q 3/103 269/900 |
| 4,353,672 A * | 10/1982 | Smith | ................ | B23Q 9/00 144/144.1 |
| 4,429,464 A * | 2/1984 | Burrus | ................ | G01B 5/201 73/1.01 |
| 5,604,988 A * | 2/1997 | Costelloe | ................ | B26B 29/06 33/526 |
| 6,251,487 B1 * | 6/2001 | Yonaha | ................ | B05C 11/08 427/425 |
| 6,499,222 B1 * | 12/2002 | Chien | ................ | G01B 3/14 33/1 BB |
| 6,539,636 B1 * | 4/2003 | Jennings | ................ | A41H 3/02 33/563 |
| 6,575,068 B2 * | 6/2003 | Lira-Nunez | ................ | B26B 3/08 30/294 |
| 6,594,914 B1 * | 7/2003 | Babcock | ................ | A63C 3/10 33/563 |
| 6,637,121 B2 * | 10/2003 | Barefoot | ................ | B23K 31/125 33/501.45 |
| 6,785,979 B2 * | 9/2004 | Wachtler | ................ | G01B 5/02 33/732 |

(Continued)

FOREIGN PATENT DOCUMENTS

CN     202793252 U     3/2013

*Primary Examiner* — George B Bennett
(74) *Attorney, Agent, or Firm* — CKC & Partners Co., LLC

(57) ABSTRACT

A coater cup deformation testing device includes a supporting board, a first plate and a second plate. The first plate is located on a first side surface of the supporting board. The first plate is circular and has a first diameter. The second plate is located on the first plate or on a second side surface of the supporting board. The second side surface is opposite to the first side surface. The second plate is circular and has a second diameter less than the first diameter. An area of each of the first and second plates is less than an area of the supporting board. A projection of each of the first and second plates on the supporting board is formed within the supporting board.

15 Claims, 7 Drawing Sheets

(56) References Cited

U.S. PATENT DOCUMENTS

| | | | |
|---|---|---|---|
| 6,981,332 B2 * | 1/2006 | Barefoot | B23K 31/125 33/501.45 |
| 6,998,629 B2 * | 2/2006 | Fan | G01V 8/12 250/548 |
| 7,513,049 B2 * | 4/2009 | Williams | B43L 7/033 33/501.45 |
| 7,543,388 B2 * | 6/2009 | Christensen | E04F 21/003 33/562 |
| D610,176 S * | 2/2010 | Nagamine | G01B 5/30 D15/138 |
| 7,781,341 B2 * | 8/2010 | Nakazawa | H01L 21/02087 438/700 |
| 7,861,429 B2 * | 1/2011 | Lee | G01B 3/42 33/832 |
| 8,261,463 B2 * | 9/2012 | Trisko | A47G 1/215 33/645 |
| 8,468,709 B2 * | 6/2013 | Akdeniz | B29C 73/24 33/563 |
| 8,499,470 B1 * | 8/2013 | Hilton | D05B 97/12 33/562 |
| 8,893,394 B2 * | 11/2014 | Parkin | G01B 3/30 33/562 |
| 9,067,459 B2 * | 6/2015 | Bennet | B43L 13/002 |
| 9,082,802 B2 * | 7/2015 | Yang | H01L 21/681 |
| 9,109,875 B2 * | 8/2015 | Marisa | E04D 15/025 |
| 9,441,933 B2 * | 9/2016 | Yaphe | F21V 21/00 |
| 9,897,430 B2 * | 2/2018 | Layton, Jr. | G01B 5/25 |
| 9,968,224 B1 * | 5/2018 | Domerski | G01B 3/14 |
| 10,421,867 B2 * | 9/2019 | Liu | H01L 21/0271 |
| 10,625,372 B2 * | 4/2020 | Valente | B23K 26/032 |
| 10,788,301 B2 * | 9/2020 | Colley | G01B 3/56 |
| 11,638,946 B2 * | 5/2023 | Lara Dominguez | B21F 1/002 72/369 |
| 2012/0137532 A1 * | 6/2012 | Yeh | A41H 3/002 33/562 |
| 2012/0230155 A1 * | 9/2012 | Kawaguchi | H03H 3/02 29/25.35 |
| 2014/0045344 A1 * | 2/2014 | Terao | H01L 21/6715 118/313 |
| 2015/0021496 A1 * | 1/2015 | Shabbir | G01N 27/44721 33/563 |
| 2015/0343628 A1 * | 12/2015 | Moreland | B25H 7/005 33/562 |
| 2016/0305757 A1 * | 10/2016 | Rhee | A47G 27/00 |
| 2017/0002208 A1 * | 1/2017 | Cheng | C09D 7/20 |
| 2017/0176163 A1 * | 6/2017 | Herrles | G01B 21/32 |
| 2019/0015969 A1 * | 1/2019 | Doane | B25H 7/045 |
| 2020/0033723 A1 * | 1/2020 | Yang | H01L 22/10 |

* cited by examiner

COATER CUP DEFORMATION TESTING DEVICE AND METHOD OF COATER CUP DEFORMATION TESTING

BACKGROUND

Field of Invention

The present disclosure relates to a coater cup deformation testing device and a method of coater cup deformation testing.

Description of Related Art

In a semiconductor manufacturing process, a coater cup device is used for a photoresist coating process of a semiconductor wafer. When the semiconductor wafer is coated, the coater cup device accumulating the semiconductor wafer can avoid splashing of the liquid photoresist on the semiconductor wafer and stabling flow, thereby enabling uniform photoresist coating on the semiconductor wafer. However, it is possible that deformations appear on the coater cup device because of contact of the matters (e.g. wafers or liquid photoresist) and cleaning. The deformed cup device will damage the semiconductor wafer accumulated within.

Therefore, how to provide a solution for determine whether the coater cup device is deformed is one of the subjects to be solved for the industry.

SUMMARY

One aspect of the present disclosure is relative to a coater cup deformation testing device.

According to one embodiment of the present disclosure, a coater cup deformation testing device includes a supporting board, a first plate and a second plate. The first plate is located on a first side surface of the supporting board. The first plate is circular and has a first diameter. The second plate is located on the first plate or on a second side surface of the supporting board. The second side surface is opposite to the first side surface. The second plate is circular and has a second diameter less than the first diameter. An area of each of the first and second plates is less than an area of the supporting board. A projection of each of the first and second plates on the supporting board is formed within the supporting board.

In one or more embodiments of the present disclosure, the supporting board, the first plate and the second plate are concentric circles.

In some embodiments, the supporting board further includes a ruler. The ruler is formed on the supporting board. Scales of the ruler are arranged along a direction from a center of the supporting board to a periphery of the supporting board.

In some embodiments, the scales of the ruler are disposed on the supporting board and arranged at a periphery of the first plate or the second plate.

In some embodiments, the supporting board is transparent. The scales of the ruler are disposed on at least one of the first side surface and the second side surface.

In one or more embodiments of the present disclosure, the first plate and the second plate are transparent.

In one or more embodiments of the present disclosure, the coater cup deformation testing device further includes a third plate. The third plate is located on one of the first and second plates. The third plate is circular and has a diameter less than each of the diameters of the first and second plates.

An aspect of the present disclosure is related to a method of coater cup deformation testing.

According to one embodiment of the present disclosure, a method of coater cup deformation testing includes following operations. Provide a coater cup deformation testing device. The coater cup deformation testing device includes a supporting board, a first plate and a second plate. The first plate and the second plate are circular. The first plate is located on a first side surface of the supporting board. The second plate is located on the first plate or on a second side surface of the supporting board. The second side surface is opposite to the first side surface. A diameter of the second plate is less than a diameter of the first plate. Disassemble a coater cup device. The coater cup device includes a bottom cup, an upper cup and an inner cup. The inner cup is rotatably located on the bottom cup to support a semiconductor wafer. The upper cup and the bottom cup form a space accumulating the semiconductor wafer supported by the inner cup within the space. Receive the bottom cup by the first plate of the coater cup deformation testing device. Receive the upper cup by the second plate of the coater cup deformation testing device.

In one or more embodiments of the present disclosure, the method of coater cup deformation testing further includes following operations. Rotate the bottom cup after the bottom cup is received by the first plate of the coater cup deformation testing device. Rotate the upper cup after the upper cup is received by the second plate of the coater cup deformation testing device.

In one or more embodiments of the present disclosure, the bottom cup includes a first edge. The upper cup includes a second edge. The first edge is connected to the second edge to form the space accumulating the semiconductor wafer. The first edge of the bottom cup is received by the first plate of the coater cup deformation testing device. The second edge of the upper cup is received by the second plate of the coater cup deformation testing device.

In one or more embodiments of the present disclosure, the coater cup device further includes a middle cup disposed between the bottom cup and the upper cup. The middle cup extends within the space formed by the upper cup and the bottom cup to a periphery of the semiconductor wafer. The coater cup deformation testing device further includes a third plate disposed on one of the first plate and the second plate. The method of coater cup deformation testing further includes following operations. Receive the middle cup by the third plate.

In one or more embodiments of the present disclosure, the supporting board, the first plate and the second plate are concentric circles. The supporting board of the coater cup deformation testing device further includes a ruler. Scales of the ruler are arranged along a direction from a center of the supporting board to a periphery of the supporting board. The method of coater cup deformation testing further includes following operations. Align the bottom cup with the scales to define a size differential of the bottom cup if the bottom cup extends beyond the first plate when the bottom cup is received by the first plate. Align the upper cup with the scales to define a size differential of the upper cup if the upper cup extends beyond the second plate when the upper cup is received by the second plate.

In some embodiments, the supporting board is transparent. The scales of the ruler on the supporting board are configured on at least one of the first side surface and the second side surface.

In some embodiments, the first plate and the second plate are transparent.

In some embodiments, the ruler is configured on the supporting board and arrange at a periphery of the first plate or the second plate.

In summary, a coater cup deformation testing device of the present disclosure can include a supporting board and plates for testing. The plates on the supporting board can have similar shapes with cups of a coater cup device, so that the cups of the coater cup device can be received by the plates of the coater cup deformation testing device if the cups are not deformed. Therefore, it can be determined that whether the coater cup device is deformed based on the receiving situations of the cups and plates.

It is to be understood that both the foregoing general description and the following detailed description are by examples, and are intended to provide further explanation of the disclosure as claimed.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

Figure 1A:
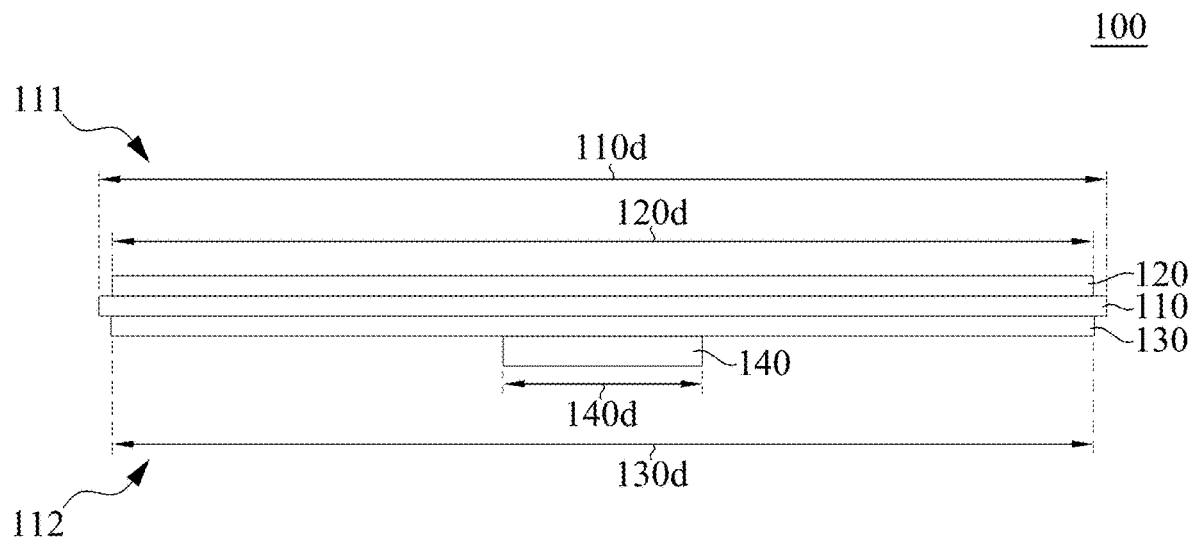
FIG. 1A illustrates a cross-section view of a coater cup deformation testing device according to one embodiment of the present disclosure.

Reference will now be made in detail to the embodiments of the present disclosure, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the disclosure.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

In order to determine deformations of a coater cup device used to accumulate a wafer, a coater cup deformation testing device and a corresponding method of coater cup deformation testing are provided, and damages caused by the deformations of the coater cup device for the wafer can be avoided.

Reference is made by FIG. 1A. FIG. 1A illustrates a cross-section view of a coater cup deformation testing device 100 according to one embodiment of the present disclosure.

As shown in FIG. 1A, in this embodiment, a coater cup deformation testing device 100 includes a supporting board 110, a plate 120, a plate 130 and a plate 140. The supporting board 110 includes a first side surface 111 and an opposite second side surface 112. The plate 120 is located on the first side surface 111 of the supporting board 110. The plate 130 is located on the second side surface 112. The plate 140 is located on the plate 130, and the plate 130 is located between the supporting board 110 and the plate 140.

Figure 1B:
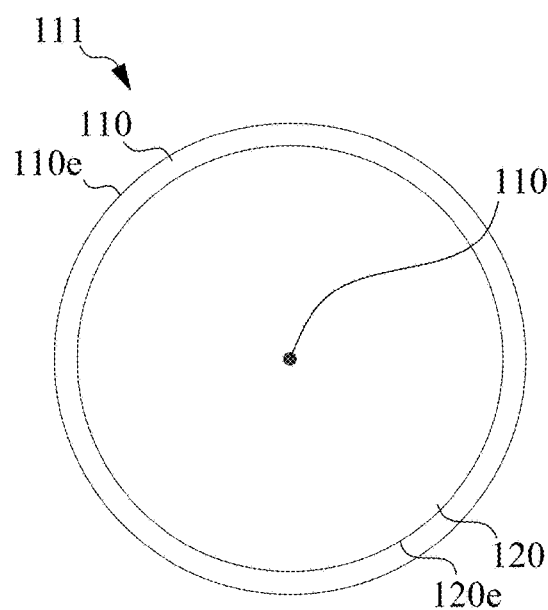
FIG. 1B illustrates a top view of the coater cup deformation testing device of FIG. 1A.
Figure 1C:
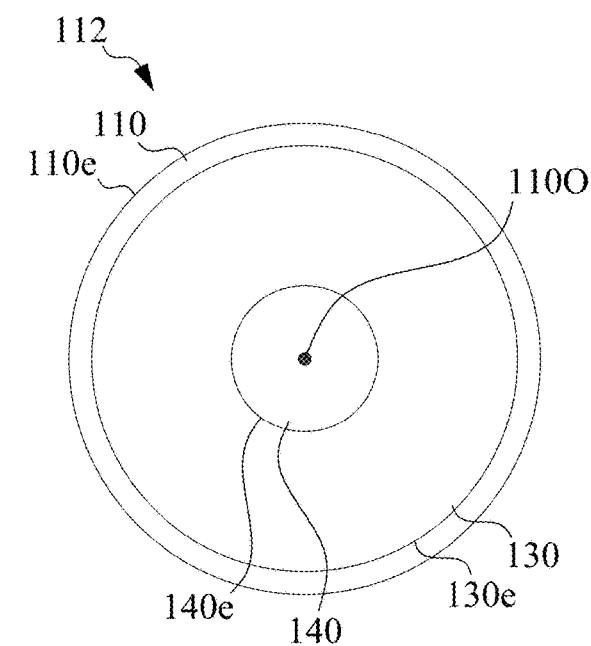
FIG. 1C illustrates a bottom view of the coater cup deformation testing device of FIG. 1A.

Reference is also made by FIGS. 1B and 1C. FIG. 1B illustrates a top view of the coater cup deformation testing device 100 of FIG. 1A. FIG. 1C illustrates a bottom view of the coater cup deformation testing device 100 of FIG. 1A.

As shown in FIGS. 1B and 1C, in this embodiment, shapes of the plate 120, the plate 130 and the plate 140 are circle, and the plate 120, the plate 130 and the plate 140 can respectively receive cups forming a coater cup device used to accumulate a wafer. In some embodiment, since a shape of the wafer is circle generally, shapes of the cups forming the coater cup device are circle. Therefore, the circle cups forming the coater cup device can be respectively received by the plate 120, the plate 130 and the plate 140 with circle shapes if no deformation appears on the cups. In other words, it can be determined whether the cups have deformations according to that whether the cups can be received by the plates (e.g. plates 120, 130 and 140 in FIG. 1A).

A shape of the supporting board 110 is circle, and the supporting board 110 has a center 1100. In this embodiment, the supporting board 110, the plate 120, the plate 130 and the plate 140 are concentric circles with the same center 1100.

Return to FIG. 1A. In this embodiment, the supporting board 110 has a diameter 110$d$, the plate 120 has a diameter 120$d$, the plate 130 has a diameter 130$d$ and the plate 140 has a diameter 140$d$. As shown in FIG. 1A, the diameter 110$d$ is the greatest one of the diameters 110$d$, 120$d$, 130$d$ and 140$d$, so that the supporting board 110 can support the plate 120, the plate 130 and the plate 140. The diameter 130$d$ is slightly greater than the diameter 120$d$, and the diameter 140$d$ is less than any of the diameters 120$d$ and 130$d$.

Please refer to FIG. 1B. The top view from the first side surface 111 shown in FIG. 1B illustrates the supporting board 110 and the plate 120 located on the supporting board 110. The supporting board 110 has a periphery 110e. The plate 120 has a periphery 120e. As mentioned above, the supporting board 110 and the plate 120 are concentric circles with the same center 1100. Refer to FIGS. 1A and 1B, the diameter 110d of the supporting board 110 is greater than the diameter 120d of the plate 120.

Similarly, please refer to FIG. 1C. The bottom view from the second side surface 112 shown in FIG. 1C illustrates the supporting board 110, the plate 130 and the plate 140. The plate 130 has a periphery 130e. The plate 140 has a periphery 140e. Refer to FIGS. 1A and 1C, in this embodiment the supporting board 110, the plate 130 and the plate 140 are concentric circles with the same center 1100, the diameter 110d of the supporting board 110 is greater than the diameter 130d of the plate 130, and the diameter 140d of the plate 140 is less than the diameter 130d of the plate 130.

In some embodiments, the plate 140 can be not located on the plate 130d but on the plate 120. In such case, the diameter 140d is still less than the diameter 120d of the plate 120.

In some embodiments, the shape of the supporting board 110 can be different from circuit and have an area greater than any of areas of the plate 120, the plate 130 and the plate 140. An area of each of the plates 120, 130 and 140 is less than the area of the supporting board 110. In other words, a projection of each of the plates 120, 130 and 140 on the supporting board 110 is formed within the supporting board 110.

The plates with different diameters are used to receive the cups with different sizes. For details, please refer to following discussions.

In some embodiments, materials of the supporting board 110, the plate 120, the plate 130 and the plate 140 are transparent, and a ruler can be provided or marked on the supporting board 110 to measuring the deformations by scales of the ruler. In such case, the ruler on the supporting board 110 can be shown on the plate 120, the plate 130 and the plate 140 since the supporting board 110, the plate 120, the plate 130 and the plate 140 are transparent. For details, please also refer to following discussions.

In some embodiments, material of the transparent supporting board 110, the plate 120, the plate 130 and the plate 140 includes acrylic.

Figure 2A:
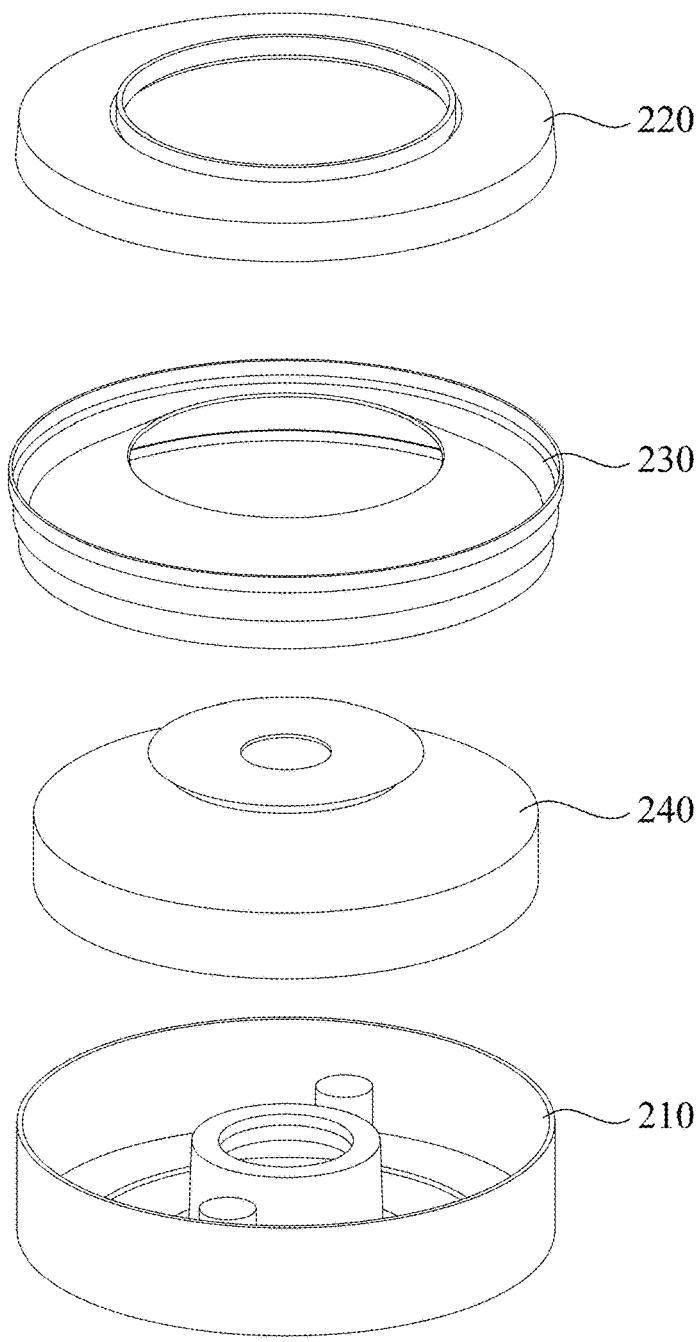
FIG. 2A illustrates a exploded view of a coater cup device according to one embodiment of the present disclosure.
Figure 2B:
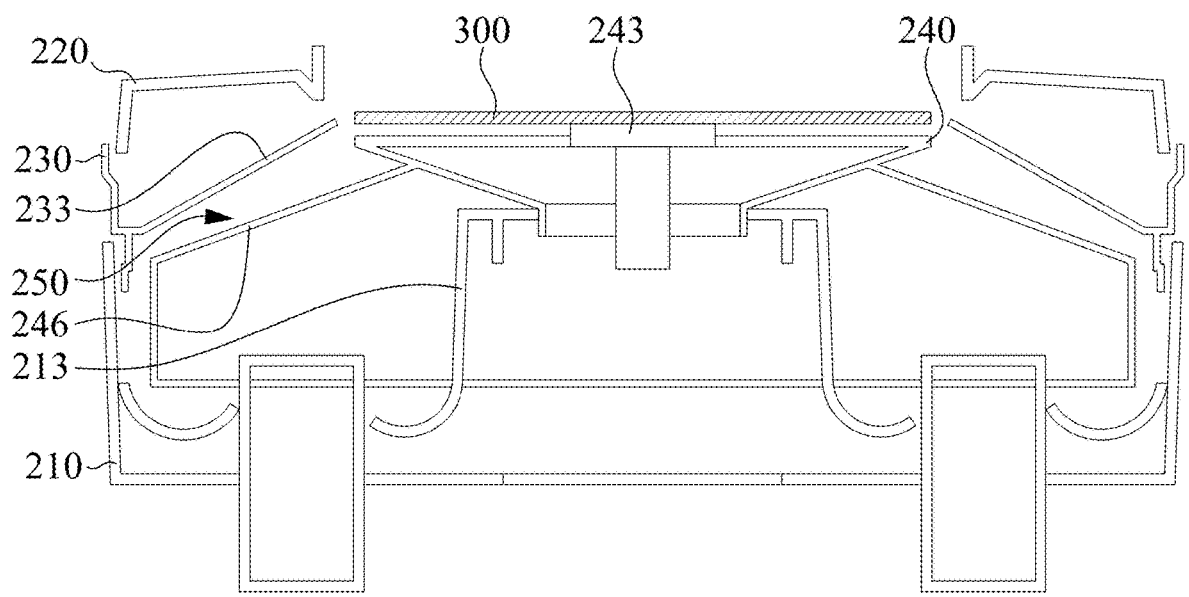
FIG. 2B illustrates a cross-section view of the coater cup device of FIG. 2A, wherein the coater cup device accumulates a semiconductor wafer.

Reference is made by FIGS. 2A and 2B. FIG. 2A illustrates an exploded view of a coater cup device 200 according to one embodiment of the present disclosure. FIG. 2B illustrates a cross-section view of the coater cup device 200 of FIG. 2A, wherein the coater cup device 200 can be used to accumulate a semiconductor wafer 300.

As shown in FIGS. 2A and 2B, in this embodiment, the coater cup device 200 includes a bottom cup 210, an upper cup 220, a middle cup 230 and an inner cup 240. The inner cup 240 is configured in the bottom cup 210. The middle cup 230 and the upper cup 220 and located on the bottom cup 210 and the inner cup 240 sequentially.

In FIG. 2B, the inner cup 240 is located on a holder 213 of the bottom cup 210, and the holder 213 has an edge 211. The edge 211 of the holder 213 can be regarded as an edge of the bottom cup 210. A spin chuck 243 is located on the inner cup 240. A spin motor is configured within the holder 213. For the purpose of simplify, the spin motor is not shown in figures. The spin chuck 243 is located on the spin motor within the holder 213 and contact with the edge 211 of the holder 213. Therefore, the semiconductor wafer 300 can be positioned on the spin chuck 243. By using a rotation structure connected to the spin chuck 243, the semiconductor wafer 300 located on the spin chuck 243 can be rotated, and a spin coating process for the semiconductor wafer 300 can be performed.

As shown in FIG. 2B, the semiconductor wafer 300 and the bottom cup 210 are further covered by the middle cup 230, which includes a shield 233 extending diagonally upward to a center of the coater cup device 200. The middle cup 230 has an edge 231 (as shown in following FIG. 3), and the middle cup 230 is contact with the bottom cup 210 by the edge 231. The shield 233 and a sidewall 246 of the inner cup 240 beyond the spin chuck 243 form a flowing path 250. Once a spin coating process is performed on the semiconductor wafer 300, the flowing path 250 is used to receive coatings during the spin coating process, so that the coatings can be removed through the flowing path 250.

The bottom cup 210, the inner cup 240 and the middle cup 230 are further covered by the upper cup 220. As shown in FIG. 2B, the upper cup 220 has an edge 221 (as shown in following FIG. 3), and the upper cup 220 is contact with the middle cup 230 through the edge 221. The upper cup 220 is used to prevent the coating on the semiconductor wafer 300 from splashing out of the coater cup device 200 during the spin coating process.

A number of the plates (e.g. plates 120, 130 and 140) of the coater cup deformation testing device 100 is determined according to a number of cups forming the coater cup device to be tested. In this embodiment, the coater cup deformation testing device 100 is used to test a coater cup device 200 formed by three cups as shown in the FIGS. 2A and 2B, the coater cup deformation testing device 100 includes three plates, and the number of the plates of the coater cup deformation testing device 100 is the same as the number of the cups of the coater cup device 200.

In some embodiments, a coater cup device used to accumulate a wafer can be formed by two cups, which include a bottom cup supporting a wafer holder and an upper cup covering the bottom cup and the wafer holder to avoid coatings splashes. In such case, a coater cup deformation testing device can include only two plates, and the number of the plates of the coater cup deformation testing device is the same as the number of the cups of the coater cup device.

To describe detailed deformation operations by using the coater cup deformation testing device 100, please refer to following FIGS. 3-6. FIGS. 3-6 illustrate schematic views corresponding to different operations of a method of coater cup deformation testing of the present disclosure.

In an operation of the method of coater cup deformation testing, a coater cup device 200 is provided. The example coater cup device 200 is provided as shown in FIGS. 2A and 2B. The coating coater cup device 200 includes the bottom cup 210, the upper cup 220, the middle cup 230 and the inner cup 240. The inner cup 240 is rotatably located on the bottom cup 210 to support a semiconductor wafer 300, as shown in FIG. 2B. The upper cup 220 and the bottom cup 210 form a space accumulating the semiconductor wafer 300 supported by the inner cup 240 within the space.

In an operation of the method of coater cup deformation testing, a coater cup deformation testing device 100 is provided. The example coater cup deformation testing device 100 is provided as shown in FIGS. 1A-1C. The number of the plates of the coater cup deformation testing device 100 is determined based on the number of the cups of the coater cup device 200, thereby being three. In this embodiment, the coater cup deformation testing device 100 includes the supporting board 110, the plate 120, the plate 130 and the plate 140. The supporting board 110, the plate 120, the plate 130 and the plate 140 are circular. The plate 120 and the plate 130 respectively located on the first side surface 111 and the second side surface 112 of the supporting board 111. The plate 140 is located on the plate 130.

Once the bottom cup 210, the middle cup 220 and the upper cup 230 are deformed, deformations of the bottom cup 210, the middle cup 220 and the upper cup 230 reflect on the edges 211, 221 and 231, respectively. In such case, it is possible that the upper cup 220, the shield 233 of the middle cup 230 or the spin chuck 243 is unexpected contact with and damages with the semiconductor wafer 300.

The plates (e.g. plates 120, 130 and 140) of the coater cup deformation testing device 100 are designed to have matched diameters to receive the cups of the coater cup device 200. If one the cups of the coater cup device 200 are deformed, the corresponding plate cannot receive the deformed cup.

Figure 3:
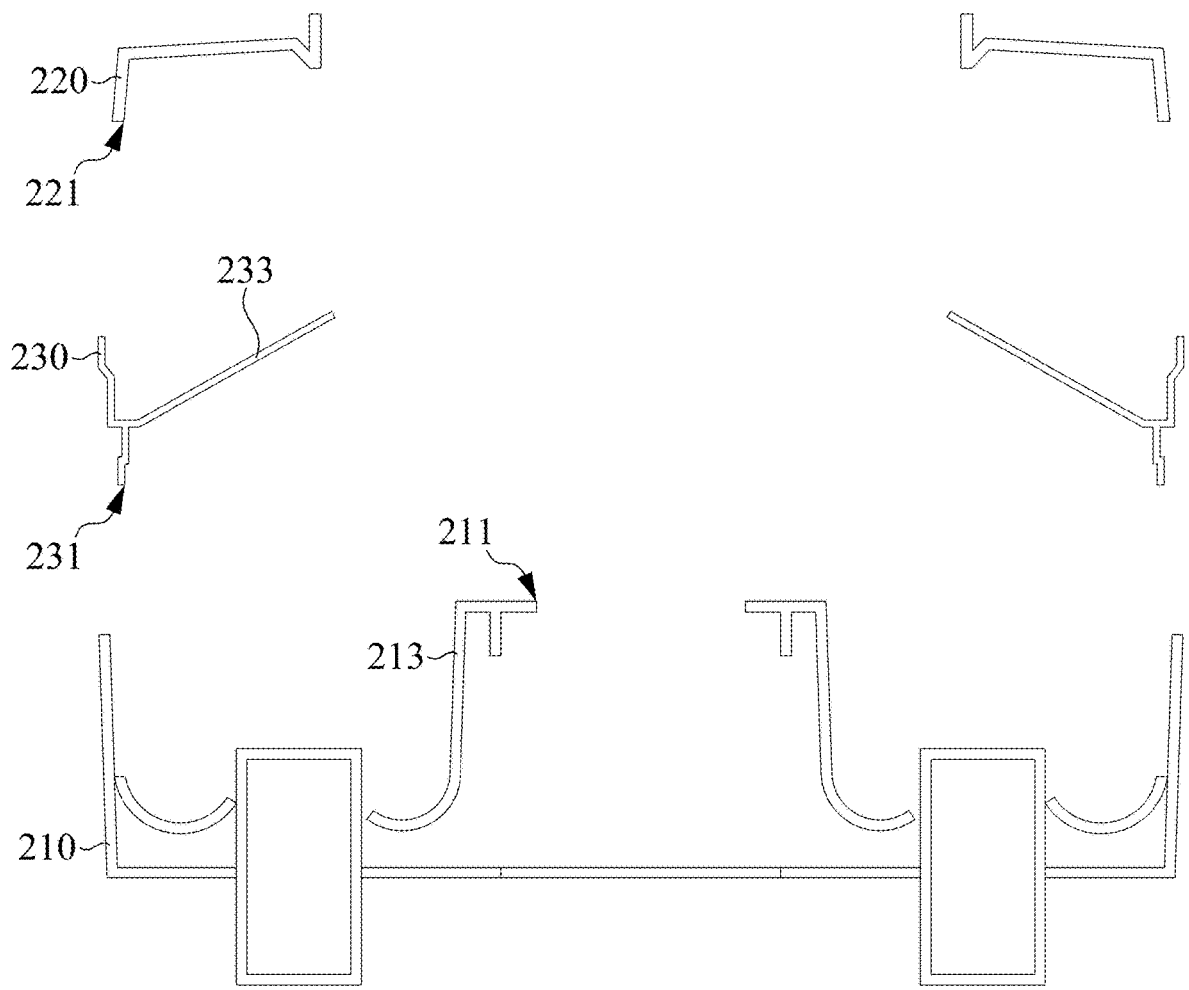
FIG. 3 illustrates a cross-section view of cups forming the coater cup device of FIG. 2A.

FIG. 3 illustrates a cross-section view of cups forming the coater cup device 200 of FIG. 2A. In one embodiment of the present disclosure, operations of the method of coater cup deformation testing include disassembling the coater cup device 200 used to accumulate the semiconductor wafer 300.

As shown in FIG. 3, the coater cup device 200 is disassembled and the inner cup 240 has been removed. The disassembled coater cup device 200 includes the bottom cup 210, the middle cup 230 and the upper cup 220. As mentioned above, in this embodiment, the bottom cup 210 is contact with the removed inner cup 240 through the edge 211 of the holder 213, the middle cup 230 is contact with the bottom cup 210 through the lower edge 231 and has the shield 233 for avoiding the splash of the coatings, the upper cup 220 is contact with the middle cup 230 through the lower edge 221.

Figure 4:
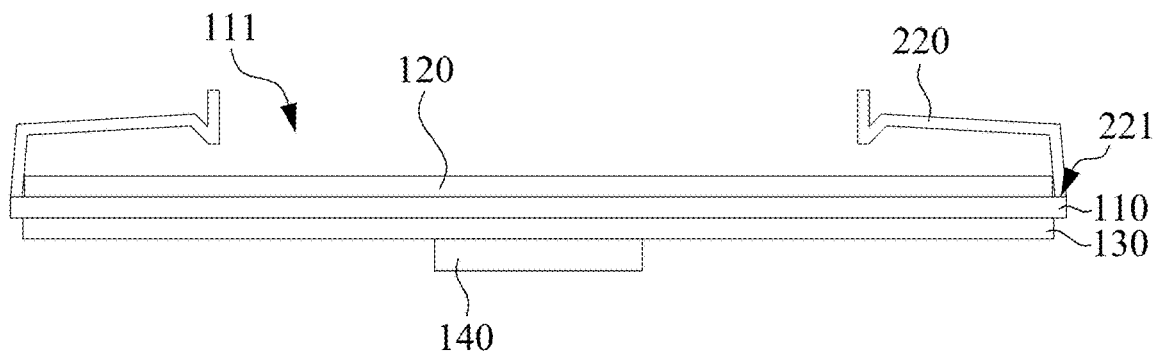
FIGS. 4~6 illustrate cross-section views of plates of the coater cup deformation testing device receiving the cups of the coater cup device according to one embodiment of the present disclosure.
Figure 5:
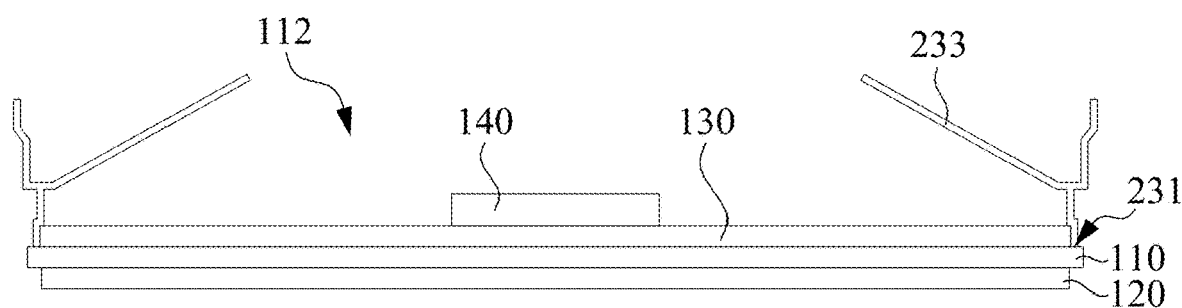
Figure 6:
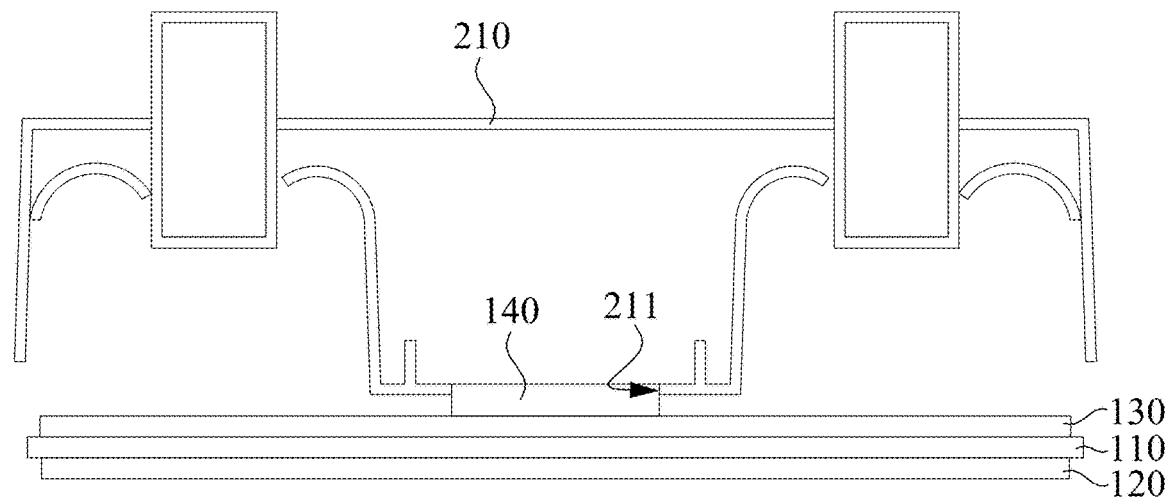

FIGS. 4~6 illustrate cross-section views of plates of the coater cup deformation testing device 100 receiving the cups of the coater cup device 200 according to one embodiment of the present disclosure.

Once one of two cups being in contact with each other is deformed, it can be easily determined whether any of the two cups is deformed by appearance when the coater cup device is assembled. For two or more cups being in contact with each other and deformed, please refer to following discussion.

FIG. 4 illustrates an operation of the method of coater cup deformation testing. As shown in FIG. 4, the upper cup 220 of the coater cup device 200 is received by the plate 120 of the coater cup deformation testing device 100.

In this embodiment, the lower edge 221 of the upper cup 220 is a circle, and the plate 120 is designed to be a circle with the diameter 120d being the same as the diameter of the lower edge 221. Therefore, as shown in FIG. 4, if no deformation appears on the upper cup 220, the upper cup 220 can be received on the plate 120, and the periphery 120e of the plate 120 is within the edge 221 of the upper cup 220. The diameter 120d of the plate 120 is slightly less than the edge 221 of the upper cup 220.

In some embodiment, after the upper cup 220 is received by the plate 120, the upper cup 220 can be further rotated to determine whether the upper cup 220 is deformed. If the upper cup 220 has been deformed from the circle to an oval, the upper cup 220 cannot rotate along the plate 120.

If the upper cup 220 is deformed to an oval, the upper cup 220 cannot be received by the plate 120 since the edge 221 of the upper cup 220 is not a circle. If the upper cup 220 is stretched, it is easily observed that the edge 221 of the upper cup 220 has a greater diameter with respect to the plate 120 after the stretched upper cup 220 is received by the plate 120.

Therefore, it can be determined that whether the upper cup 220 is deformed according to that whether the upper cup 220 can be received by the plate 120 and the upper cup 220 can rotate along the plate 120 after the upper cup 220 is received by the plate 120.

FIG. 5 also illustrates an operation of the method of coater cup deformation testing. In FIG. 5, the middle cup 230 is received by the plate 130, such that the middle cup 230 is positioned on the plate 130 and the periphery 130e of the plate 130 is located within the lower edge 231 of the middle cup 230.

The diameter 130d of the plate 130 is slightly less than the edge 231 of the middle cup 230. Similarly, the edge 231 of the middle cup 230 can reflect the deformations of the middle cup 230. If the middle cup 230 is deformed to an oval, the middle cup 230 cannot be received by the plate 130 since the edge 231 of the middle cup 230 is not a circle. If the middle cup 230 is stretched, it is easily observed that the edge 231 of the middle cup 230 has a greater diameter with respect to the plate 130 after the stretched middle cup 230 is received by the plate 130.

In some embodiment, after the middle cup 230 is received by the plate 130, the middle cup 230 can be further rotated to determine whether the middle cup 230 is deformed. If the middle cup 230 has been deformed from the circle to an oval, the middle cup 230 cannot rotate along the plate 130.

FIG. 6 also illustrates another operation of the method of coater cup deformation testing. In FIG. 6, the bottom cup 210 of the coater cup device 200 is received by the plate 140 of the coater cup deformation testing device 100. Specifically, the holder 213 of the bottom cup 210 is received by the plate 140. After receiving the holder 213 of the bottom cup 210, the holder 213 is located on the plate 130, and the periphery 140e of the plate 140 is located within the edge 211 of the holder 213.

In some embodiment, it can be determined that whether the bottom cup 210 is deformed according to that whether the bottom cup 210 can be received by the plate 140 and the bottom cup 210 can rotate along the plate 140 after the bottom cup 210 is received by the plate 140. In some embodiments, if the bottom cup 210 is deformed to an oval, the bottom cup 210 cannot be received by the plate 140 since the edge 211 of the bottom cup 210 is not a circle. If the bottom cup 210 is stretched, it is easily observed that the edge 211 of the bottom cup 210 has a greater diameter with respect to the plate 140 after the stretched bottom cup 210 is received by the plate 140.

In some embodiment, the diameter 120d of the plate 120 is about 410 mm, the diameter 130d of the plate 130 is about 409 mm, which is less than the diameter 120d, and the diameter 140d of the plate 140 is about 217.6 mm, which is less than the diameter 130d.

Figure 7:
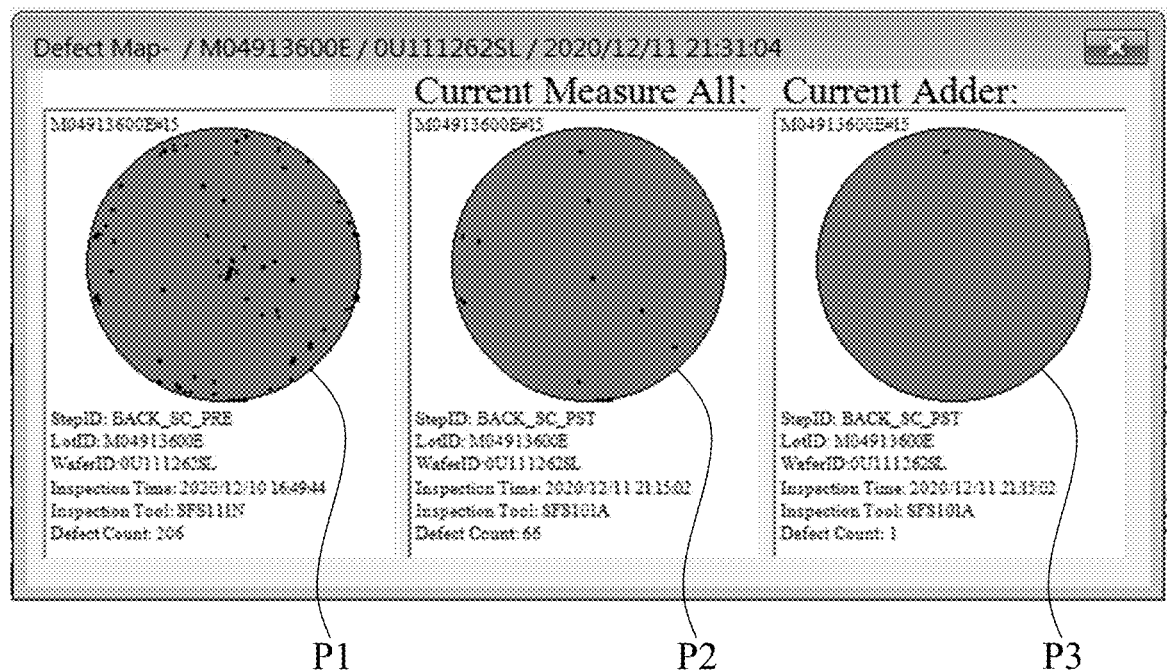
FIG. 7 illustrates a re-determination operation of the coater cup device by using a test wafer according to one embodiment of the present disclosure.

FIG. 7 illustrates a re-determination operation of the coater cup device by using a test wafer according to one embodiment of the present disclosure. The re-determination operation can be regarded as an operation of the method of coater cup deformation testing according to one embodiment of the present disclosure. In this embodiment, FIG. 7 illustrates a defect map of the test wafer located in the tested coater cup device 200, which is formed by un-deformed cups.

After the cups of the coater cup device 200 are received by the plates of the coater cup deformation testing device 100, it can be determined that whether the cups of the coater cup device 200 are deformed. Therefore, it prevents the semiconductor processed in the coater cup device 200 from being damaged, and quality of the semiconductor processed in the coater cup device 200 can be confirmed.

In some embodiments, if one of the cups of the coater cup device 200 are deformed, the deformed cup can be fixed or replaced by an un-deformed cup.

To confirm the deformation situation of the coater cup device 200, a test wafer can be further positioned within the tested coater cup device 200. FIG. 7 includes three graphs P1, P2 and P3, which are respectively corresponding to the test wafer in the tested coater cup device 200. Defects are presented as black points in graphs P1, P2 and P3.

Please refer the graphs P1 and P2. The graph P1 reflects defects on the test wafer in the tested coater cup device 200, which includes un-deformed cups. After being processed in the tested coater cup device 200 with the un-deformed cups, the test wafer is reflected on the graph P2, which presents fewer defects with respect to the graph P1. In some embodiments, the process of the test wafer in the tested coater cup device 200 is a coating process.

It should be noted that a ring-like defect appears on the test wafer if any of the cups (e.g. the upper cup 220 or the shield 233 of the middle cup) of the coater cup device 200 or the wafer holder 240 is contact with the test wafer. As shown in the graph P2, there is no ring-like defect appearing on the test wafer. The graph P3 presents the further defect from the graph P1 to the graph P2. Comparing the graphs P1 and P2, the graph P3 shows the comparison result and presents the additional defect on the graph P2 and beyond the graph P1, and there is no ring-like defect on the graph P3. Therefore, it can be confirmed that the coater cup device 200 is un-deformed.

Figure 8A:
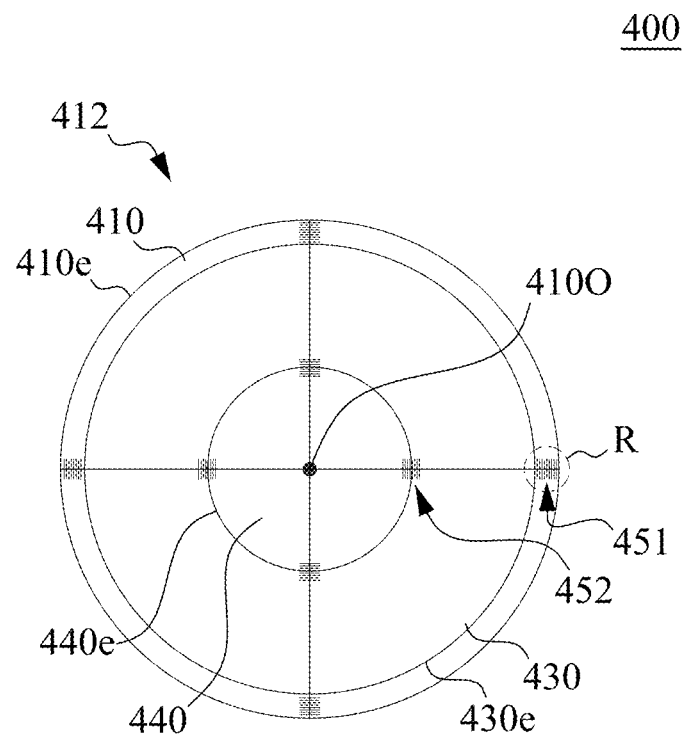
FIG. 8A illustrates a top view of a coater cup deformation testing device according one embodiment of the present disclosure.
Figure 8B:
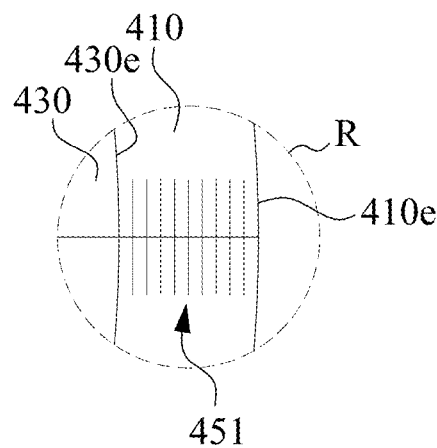
FIG. 8B illustrates a local view of a ruler on the supporting board of the coater cup deformation testing device of FIG. 8A.

Reference is made by FIGS. 8A and 8B. FIG. 8A illustrates a bottom view of a coater cup deformation testing device 400 according one embodiment of the present disclosure. FIG. 8A illustrates a bottom view from a second side surface 412 of the supporting board 410. FIG. 8B illustrates a local view of a ruler on the supporting board 410 of the coater cup deformation testing device 400 of FIG. 8A. FIG. 8B illustrates a region R between the periphery 430e and the periphery 410e in FIG. 8A.

In this embodiment, a coater cup deformation testing device 400 includes a supporting board 410, a plate on a first side surface of the supporting board 410 (not shown), a plate 430 on a second side surface 412 of the supporting board 410 and the plate 440 located on the plate 430. As shown in FIG. 8A, the supporting board 410, the plate 430 and the plate 440 are concentric circles with the same center 410O.

In this embodiment, the supporting board 410 includes ruler 451 and 452. In FIG. 8B, the rulers 451 are located between the periphery 410e of the supporting board 410 and the periphery 430e of the plate 430. Scales of the rulers 451 and 452 are arranged along a direction from the center 410O of the supporting board 410 to the periphery 410e of the supporting board 410. As shown in FIG. 8B, scales of one of the rulers are arranged between the periphery 410e of the supporting board 410 and the periphery 430e of the plate 430 at equal intervals. In some embodiments, a length between two immediately-adjacent scales is 1 mm.

In some embodiments, a coater cup device 200 as shown in FIGS. 2A and 2B is provided. Once an upper cup 220 of the coater cup device 200 is received by the plate 430, the upper cup 220 received by the plate 430 can be aligned with the scales of the ruler 451 between the edges 410e and 430e. If the upper cup 220 is deformed and extends beyond the plate 430, a sized differential of the deformed upper cup 220 can be defined by the scales of the ruler 451.

In some embodiments, the supporting board 410 is transparent, the scales of the ruler 451 on the supporting board 410 can be configured on at least one of the first side surface and the second side surface 412, and the scales of the ruler 451 can be shown on both side surfaces of the supporting board 410. For example, the scales of the ruler 451 can be marked on the second side surface 412 of the supporting board 410. Therefore, the scales of ruler 451 can be also used for a bottom cup 210 of the coater cup device 200. When the bottom cup 210 is received by the plate on a first side surface (not shown), the bottom cup 210 can be also aligned with the scales of the ruler 451 present on the first side surface to define the size differential of the bottom cup 210 if the bottom cup 210 is deformed and extends beyond the plate on the first side surface.

As shown in FIG. 8A, four regions of the rulers 451 are arranged along a cross-line across the center 410O. In other words, the four regions of the rulers 451 are located on the four points between the periphery 430e of the plate 430 and the periphery 410e of the supporting board 410. In this way, deformations along different directions of the upper cup 220 can be defined by the rulers 451.

Similarly, in this embodiment, four regions of the rulers 452 are arranged along a cross-line across the center 410O. As shown in FIG. 8A, the four regions of the rulers 452 are at the periphery 440e of the plate 440. The four regions of the rulers can be used to define the deformations in different directions when a bottom cup 210 of the coater cup device 200 is received by the plate 440. In this embodiment, scales of the ruler 452 in the same regions are arranged along the direction form the center 410O of the supporting board 410 to the periphery 410e of the supporting board 410 at equal intervals.

In some embodiments, the coater cup deformation testing devices of the present disclosure can be regarded as coater cup deformation testing jigs, thereby removing coater cup device with deformed cups.

In summary, a coater cup deformation testing device of the present disclosure can include a supporting board and plates for testing. The plates on the supporting board can have similar shapes with cups of a coater cup device, so that the cups of the coater cup device can be received by the plates of the coater cup deformation testing device if the cups are not deformed. In some embodiments, rulers can be provided on coater cup deformation testing device to measure and define the deformations of the cup of the coater cup device. Therefore, it can be determined that whether the coater cup device is deformed based on the receiving situations of the cups and plates.

Although the embodiments of the present disclosure have been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A coater cup deformation testing device, comprising:
a supporting board;
a first plate disposed on a first side surface of the supporting board, wherein the first plate is circular and has a first diameter; and
a second plate disposed on the first plate or on a second side surface of the supporting board, wherein the second side surface is opposite to the first side surface, the second plate is circular and has a second diameter less than the first diameter,
wherein an area of each of the first and second plates is less than an area of the supporting board, and a projection of each of the first and second plates on the supporting board is formed within the supporting board.

2. The coater cup deformation testing device of claim 1, wherein the supporting board, the first plate and the second plate are concentric circles.

3. The coater cup deformation testing device of claim 2, wherein the supporting board further comprises:
a ruler formed on the supporting board, wherein scales of the ruler are arranged along a direction from a center of the supporting board to a periphery of the supporting board.

4. The coater cup deformation testing device of claim 3, wherein the scales of the ruler are disposed on the supporting board and arranged at a periphery of the first plate or the second plate.

5. The coater cup deformation testing device of claim 3, wherein the supporting board is transparent, and the scales of the ruler are disposed on at least one of the first side surface and the second side surface.

6. The coater cup deformation testing device of claim 1, wherein the first plate and the second plate are transparent.

7. The coater cup deformation testing device of claim 1, further comprising:
a third plate disposed on one of the first and second plates, wherein the third plate is circular and has a diameter less than each of the diameters of the first and second plates.

8. A method of coater cup deformation testing, comprising:
providing a coater cup deformation testing device, wherein the coater cup deformation testing device comprises a supporting board, a first plate and a second plate, the first plate and the second plate are circular, the first plate is disposed on a first side surface of the supporting board, the second plate is disposed on the first plate or on a second side surface of the supporting board, the second side surface is opposite to the first side surface, a diameter of the second plate is less than a diameter of the first plate;
disassembling a coater cup device, wherein the coater cup device comprises a bottom cup, an upper cup and an inner cup, the inner cup rotatably disposed on the bottom cup to support a semiconductor wafer, the upper cup and the bottom cup form a space accumulating the semiconductor wafer supported by the inner cup within the space;
receiving the bottom cup by the first plate of the coater cup deformation testing device; and
receiving the upper cup by the second plate of the coater cup deformation testing device.

9. The method of claim 8, further comprising:
rotating the bottom cup after the bottom cup is received by the first plate of the coater cup deformation testing device; and
rotating the upper cup after the upper cup is received by the second plate of the coater cup deformation testing device.

10. The method of claim 8, wherein the bottom cup comprises a first edge, the upper cup comprises a second edge, the first edge is connected to the second edge to form the space accumulating the semiconductor wafer, the first edge of the bottom cup is received by the first plate of the coater cup deformation testing device, and the second edge of the upper cup is received by the second plate of the coater cup deformation testing device.

11. The method of claim 8, wherein the coater cup device further comprises a middle cup disposed between the bottom cup and the upper cup, the middle cup extends within the space formed by the upper cup and the bottom cup to a periphery of the semiconductor wafer, the coater cup deformation testing device further comprises a third plate disposed on one of the first plate and the second plate, the method further comprises:
receiving the middle cup by the third plate.

12. The method of claim 8, wherein the supporting board, the first plate and the second plate are concentric circles, the supporting board of the coater cup deformation testing device further comprises a ruler, scales of the ruler are arranged along a direction from a center of the supporting board to a periphery of the supporting board, the method further comprises:
aligning the bottom cup with the scales to define a size differential of the bottom cup if the bottom cup extends beyond the first plate when the bottom cup is received by the first plate; and
aligning the upper cup with the scales to define a size differential of the upper cup if the upper cup extends beyond the second plate when the upper cup is received by the second plate.

13. The method of claim 12, wherein the supporting board is transparent, and the scales of the ruler on the supporting board are disposed on at least one of the first side surface and the second side surface.

14. The method of claim 13, wherein the first plate and the second plate are transparent.

15. The method of claim of claim 12, wherein the ruler is disposed on the supporting board and arrange at a periphery of the first plate or the second plate.

* * * * *